(12) United States Patent
Nishimura et al.

(10) Patent No.: US 6,496,249 B2
(45) Date of Patent: Dec. 17, 2002

(54) EXPOSURE APPARATUS

(75) Inventors: Yasunori Nishimura, Nara (JP); Taimi Oketani, Mie (JP); Tsuyoshi Naraki, Tokyo (JP)

(73) Assignees: Sharp Kabushiki Kaishi, Osaka (JP); Nikon Corporation, Tokyo (JP)

( * ) Notice: Subject to any disclaimer, the term of this patent is extended or adjusted under 35 U.S.C. 154(b) by 4 days.

(21) Appl. No.: 09/766,337

(22) Filed: Jan. 19, 2001

(65) Prior Publication Data

US 2001/0009455 A1 Jul. 26, 2001

(30) Foreign Application Priority Data

Jan. 21, 2000 (JP) .................................. 2000-013280

(51) Int. Cl.[7] ........................ G03B 27/60; G03B 27/42; G03B 27/20
(52) U.S. Cl. ........................ 355/73; 355/53; 355/91; 269/21
(58) Field of Search ........................ 355/72, 73, 91, 355/94, 53; 269/21

(56) References Cited

U.S. PATENT DOCUMENTS

| | | | | |
|---|---|---|---|---|
| 3,328,022 A | * | 6/1967 | Miller ........................ | 269/21 |
| 5,471,279 A | * | 11/1995 | Takizawa ........................ | 269/21 |
| 5,563,683 A | * | 10/1996 | Kamiya ........................ | 355/53 |
| 5,793,474 A | * | 8/1998 | Nishi ........................ | 355/53 |
| 5,857,667 A | * | 1/1999 | Lee ........................ | 269/21 |
| 5,923,408 A | * | 7/1999 | Takabayashi ........................ | 269/21 |
| 6,032,997 A | * | 3/2000 | Elliott et al. ........................ | 269/21 |
| 6,051,067 A | * | 4/2000 | Mou et al. ........................ | 118/500 |

* cited by examiner

*Primary Examiner*—Alan A. Mathews
(74) *Attorney, Agent, or Firm*—David G. Conlin; William J. Daley, Jr.; Edwards & Angell, LLP

(57) ABSTRACT

The present invention aims at preventing deterioration of flatness of a substrate and contamination of a substrate-holding surface of a substrate holder, which are caused by a resist leaking into the back surface of the substrate.

A substrate-holding surface of a substrate holder is provided with a first pair of grooves 31 and 32 extending from one end to the other along a scanning direction and a second pair of grooves 33 and 34 extending from one end to the other along a direction generally perpendicular to the scanning direction. The first and second grooves are positioned such that they make contact with the periphery of the substrate when the substrate is vertically or horizontally placed on the substrate holder. Even when a resist on a substrate leaks into the periphery of the back surface, the resist escapes into the grooves, thereby preventing deterioration of the flatness of the substrate or contamination of the substrate-holding surface.

20 Claims, 14 Drawing Sheets

EXPOSURE APPARATUS

FIELD OF THE INVENTION

The present invention relates to an exposure apparatus. More particularly, the present invention relates to an exposure apparatus used for exposing a pattern onto a flat substrate for fabricating a flat panel such as a liquid crystal display panel and a plasma display panel.

BACKGROUND OF THE INVENTION

Display qualities of recent liquid crystal display panels and plasma display panels are remarkably enhanced. Moreover, the liquid crystal display panels and the plasma display panels are thin and light, and thus are becoming major image display apparatuses as substitutes for CRTs. Particularly, a direct-view type active matrix liquid crystal panel is making progress in enlarging its screen size, and to that end the size of glass substrates used for fabricating the liquid crystal panels are becoming larger as well.

As an exposure apparatus for exposing element patterns of a display panel onto a large-sized glass substrate, a scanning-type exposure apparatus is known. The scanning-type exposure apparatus performs exposure by synchronously scanning a photomask or a reticle having a pattern formed thereon (hereinafter, referred to as a "mask") and a glass substrate applied with a photosensitive agent such as a photoresist (hereinafter, referred to as a "substrate").

When a photosensitive agent such as a resist is applied onto a substrate by, for example, a spin coater or the like, the resist often leak into the periphery of the back surface of the substrate. When such substrate with the resist on its back is loaded on a substrate holder of the exposure apparatus, the substrate-holding surface of the substrate holder is contaminated, and the back surface of the substrate and the substrate-holding surface of the substrate holder may not contact closely to each other causing a problem of poor flatness of an exposure area of the substrate.

According to a scanning-type exposure, the number of scanning steps may increase depending on the size of the device pattern and the size of the substrate, which may result in poor throughput. As an example, a scanning-type exposure of a substrate to a mask pattern at one to one magnification size will be described.

Assume that the size of effective exposure area of the mask is 400 mm×700 mm, the size of the substrate is 720 mm×900 mm, and the size of a substrate holder for holding the substrate is 843 mm×890 mm (the whole surface of the substrate holder consists of a vacuum-holding surface). A scanning-type exposure apparatus, which synchronously transfers a mask stage (for supporting and transporting a mask) and a substrate stage (a substrate holder for supporting a substrate), with respect to a projection optical system, is used to expose a pattern of a 17-inch SXGA liquid crystal display panel onto a substrate. The size of the 17-inch SXGA panel including a circuitry pattern surrounding a pixel region is 279.7 mm×347.2 mm.

The size relationship is shown in FIGS. 13 and 14. FIGS. 13 and 14 are schematic views showing the sizes of a rectangular substrate holder 15a and a substrate 200 held by the substrate holder 15a (which is represented by dotted lines in FIG. 14 for distinction from the substrate 200), respectively. As shown in FIG. 14, the substrate 200 is loaded on the substrate holder 15a such that the longer sides of the substrate 200 are arranged along the longer sides of the substrate holder 15a.

FIG. 15 is a schematic view for illustrating a manner of printing six 17-inch SXGA panels on the above-described substrate by using a mask 100 which has two 279.7 mm×347.2 mm circuit patterns 101 formed thereon. In FIG. 15, the substrate holder 15a is omitted.

With reference to FIG. 15, a pattern exposure for fabricating a 17-inch SXGA liquid crystal display panel is carried out as follows. First, a first scanning exposure is conducted by synchronously transferring the mask 100 and the substrate 200 in the X-direction as indicated by an arrow 1 to print two circuit patterns 101 on exposure areas 200a and 200b of the substrate 200.

Then, the mask 100 and the substrate 200 are transferred back to the exposure initiating positions to perform a second scanning exposure to print a single circuit pattern 101 on an exposure area 200c as indicated by an arrow 2. Since the length of the side of the substrate 200 is 900 mm, two circuit patterns 101 cannot be exposed at the second scanning exposure.

Next, while the substrate 200 is step transferred in the Y-direction, the mask 100 and the substrate 200 are transferred back to the exposure initiating positions to perform a third scanning exposure to print a single circuit pattern 101 on an exposure area 200d of the substrate 200 as indicated by an arrow 3. Finally, two circuit patterns 101 are printed on exposure areas 200e and 200f as indicated by an arrow 4.

According to such a conventional exposure method, even when the mask 100 is provided with two circuit patterns 101, there is a case where only a single circuit pattern 101 can be printed at a time. As a result, the number of scanning exposure increases, limiting improvement of the throughput.

SUMMARY OF THE INVENTION

In view of the current situation of exposure apparatuses, the present invention has an objective of providing an exposure apparatus in which the flatness of a substrate is not deteriorated with a photosensitive agent leaking into the back surface of the substrate, or in which a surface holding the substrate is not contaminated by the same. The present invention also has an objective of providing an exposure apparatus which requires less number of scanning steps and which has improved throughput without any device enlargement.

According to the present invention, a substrate-holding surface of a substrate holder is provided with grooves with which a periphery of a substrate make contact so that a photosensitive agent leaking into the back surface of the substrate can escape into the grooves. Furthermore, a structure of the present invention allows a substrate to be placed in sideways with respect to a substrate holder (placing the longer sides of the substrate in parallel to the shorter sides of the substrate holder) depending on the size of the apparatus and the size of the substrate. Where the substrate is placed in sideways with respect to the substrate holder, it is acceptable even when areas other than an effective exposure area should project out from the substrate holder, since there is no need of precisely controlling flatness of areas of the substrate where no pattern is to be printed.

Along with the reference numerals, the present invention is an exposure apparatus that exposes a pattern of a mask (10, 30) onto a substrate (14), comprising: a substrate holder (15a) having a substrate-holding surface to hold the substrate, the substrate-holding surface being provided with a first pair of grooves (31, 32) extending from one end to the other along a first direction (X-direction) and a second pair of grooves (33, 34) extending from one end to the other along a second direction (Y-direction) substantially perpendicular to the first direction; and a substrate stage (15) that supports the substrate holder to move in the first direction (X-direction).

The first grooves (31, 32) and second grooves (33, 34) are positioned such that they make contact with the periphery of the substrate (14) when the substrate (14) is vertically or horizontally placed on the substrate holder (15a). According to this structure, even when a photosensitive agent leaks into the periphery of the back surface of the substrate (14), the resist escapes into the first and second grooves (31, 32; 33, 34), thereby preventing deterioration of the flatness of the substrate (14) or contamination of the substrate-holding surface of the substrate holder (15a). The distance between a pair of first grooves (31, 32) may be equal to the length of the shorter sides of the rectangular substrate (14).

The exposure apparatus may be provided with a first holding member (60, 61, 62) to hold the substrate (14) at a first region (41, 42, 43) of the substrate-holding surface defined by the first pair of grooves (31, 32), and a second holding member (60, 61, 63) to hold the substrate (14) at a second region (41, 44, 45) of the substrate-holding surface defined by the second pair of grooves (33, 34). The exposure apparatus may further be provided with a selector (50) that selects one of the first holding member (60, 61, 62) and the second holding member (60, 61, 63).

The substrate holder (15a) is provided with a plurality of adsorbing pores on its substrate-holding surface. The plurality of adsorbing pores are provided over a plurality of regions which are defined by the first pair of grooves (31, 32) and the second pair of grooves (33, 34), and are selectively connected to a vacuum source (60) such as a vacuum pump with the first vacuum-holding members (60, 61, 62) and the second vacuum-holding members (60, 61, 63). The first vacuum-holding members (60, 61, 62) are used to vacuum hold the substrate (14) placed between the first pair of grooves (31, 32), while the second vacuum-holding members (60, 61, 63) are used to vacuum hold the substrate (14) placed between the second pair of grooves (33, 34). The selector (50) for selecting the first vacuum-holding members (60, 61, 62) and the second vacuum-holding members (60, 61, 63) can comprise a controller that controls opening and closing of an electromagnetic valve.

The exposure apparatus of the invention is an exposure apparatus for exposing a pattern of a mask (10, 30) onto a rectangular substrate (14), the substrate (14) being loaded on a substrate-holding surface of a substrate holder (15a), comprising: a substrate stage (15) capable of moving in a first direction (X-direction) while supporting the substrate holder (15a); and a detecting device (65, 66) for detecting whether the substrate (14) is loaded on the substrate-holding surface such that the longer sides of the substrate (14) are arranged along the first direction (X-direction). The detecting device (65, 66) can be realized with a contact switch provided on the substrate-holding surface of the substrate holder (15a), vacuum sensors provided in the middle of vacuum lines connecting with the vacuum pores in the substrate-holding surface. The substrate holder (15a) is rectangular, and a shorter side of the substrate holder (15a) is set shorter than the longer side of the substrate (14).

There is no need of precisely controlling the flatness of the areas of the substrate (14) where they are not exposed to a pattern of the mask (10, 30). Accordingly, when the substrate (14) is placed in sideways with respect to the substrate holder (15a) whose shorter sides are shorter than the longer sides of the substrate (14), it is acceptable even when areas other than the effective exposure area of the substrate (14) should project out from the substrate holder (15a). Since such non-exposed areas are allowed to project out from the substrate holder (15a), the exposure apparatus can be made small.

DESCRIPTION OF THE PREFERRED EMBODIMENTS

Hereinafter, embodiments of the present invention will be described with reference to the accompanying drawings.

Figure 1:
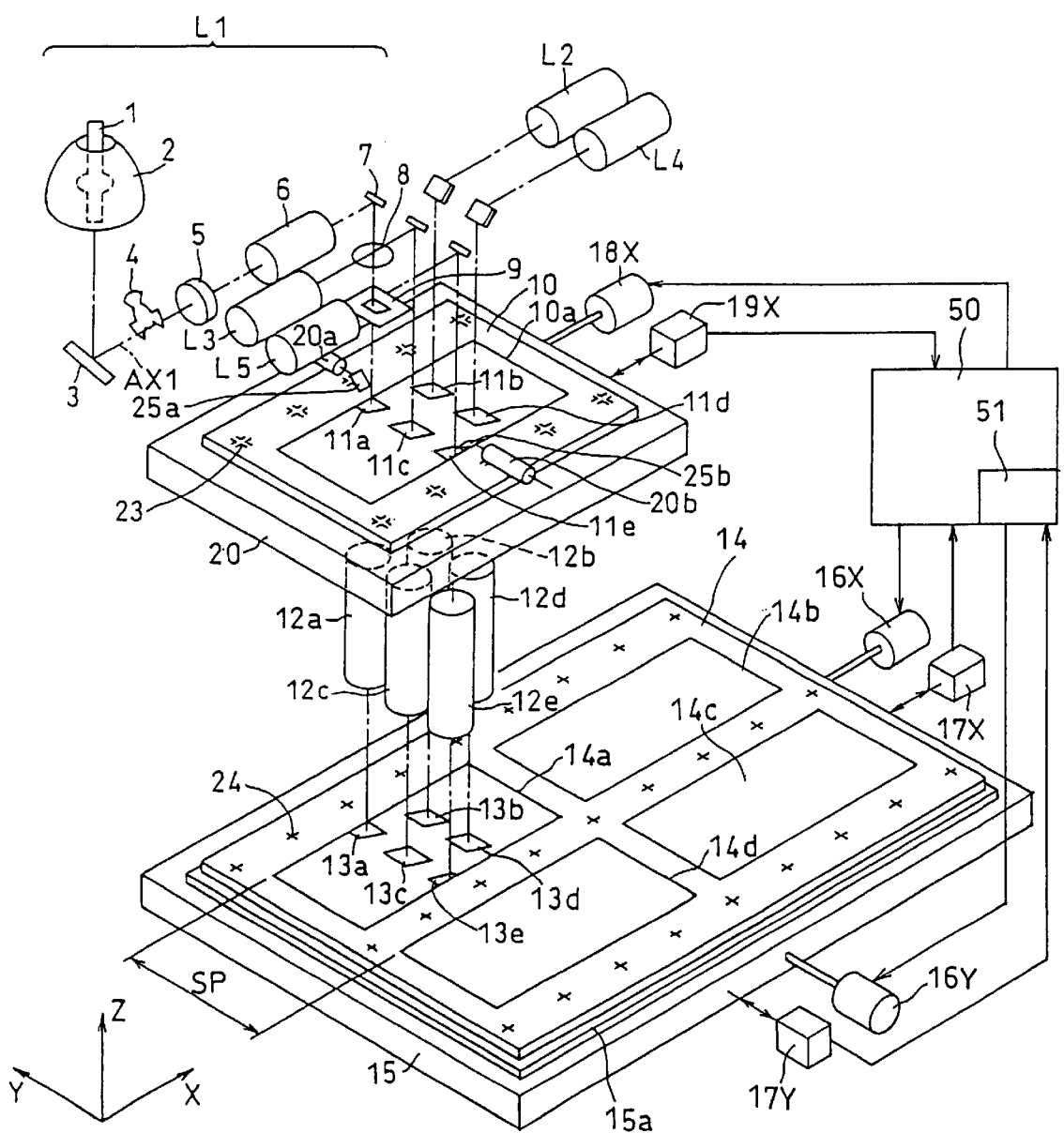
FIG. 1 is a schematic view showing an exemplary structure of a scanning-type exposure apparatus according to an embodiment of the invention.

FIG. 1 is a schematic view showing an exemplary structure of a scanning-type exposure apparatus according to an embodiment of the invention. The scanning-type exposure apparatus employs a step-and-scan system using a mask 10 which is smaller than a substrate 14 (a glass plate applied with a photosensitive agent such as a photoresist) to print a pattern drawn on the mask 10 on the substrate 14 for several times. Herein, an effective exposure area of the mask 10 is 400 mm×700 mm, and the size of the substrate 14 is 720 mm×900 mm.

An active matrix liquid crystal panel requires a plurality of pattern layers to be overlaid during the fabrication process in order to form active elements. Therefore, a plurality of masks are prepared which are used in turn for printing the overlaid patterns.

A light bundle emitted from a light source 1 such as an extra-high pressure mercury lamp is reflected off an oval mirror 2 and directed toward a dichroic mirror 3. The dichroic mirror 3 reflects the light bundle in a wavelength range necessary for exposure and transmits the light bundle in other wavelength ranges. A shutter 4 arranged with respect to the optical axis AX1 selectively controls the advance of the light bundle reflected off the dichroic mirror 3 to a following projection optical system. When the shutter 4 is open, the light bundle enters into a wavelength selection filter 5 which outputs a light bundle with a wavelength (usually, at least one of band ranges of G-, H- and I-lines) suitable for the projection optical system 12a to print. An intensity distribution of this light bundle is of a Gaussian type where intensity is the highest in the vicinity of the optical axis and becomes lower toward the periphery. Therefore, the intensity has to be made uniform at least within a projection region 13a by the projection optical system 12a. The intensity of the light bundle is made uniform with a flys' eye lens 6 and a condenser lens 8. A mirror 7 which bends the light is provided as a matter of device arrangement.

The light bundle with a uniformly-distributed intensity proceeds to a pattern plane of the mask 10 via a field stop 9. The field stop 9 has an opening for defining the projection region 13a on the substrate 14. Optionally, a lens system can be provided between the field stop 9 and the mask 10 such that the field stop 9, the pattern plane of the mask 10 and a projection plane of the substrate 14 conjugate with each other.

The structure from the light source 1 to the field stop 9 is referred to as an illuminating optical system L1 for the projection optical system 12a. Herein, illuminating optical systems L2 to L5 having the same structure as the illuminating optical system L1 are provided to supply light bundles to projection optical systems 12b to 12e, respectively. Light bundles outcoming from the multiple illuminating optical systems L1 to L5 illuminate different regions (illuminated areas) 11a to 11e on the mask 10. The plurality of light bundles that passed through the mask 10 form pattern images of the illuminated areas 11a to 11e of the mask 10 on respective projection regions 13a to 13e of the substrate 14 via the projection optical systems 12a to 12e corresponding to the respective illuminating optical systems L1 to L5. The projection optical systems 12a to 12e all form erect real images (erect normal images) at one to one magnification. In FIG. 1, the direction of optical axes of the projection optical systems 12a to 12e is referred to as Z-direction. The direction of scanning the mask 10 and the substrate 14 (perpendicular to the Z-direction) is referred to as X-direction (a first direction). The direction perpendicular to both Z- and X-directions is referred to as Y-direction (a second direction).

Figure 13:
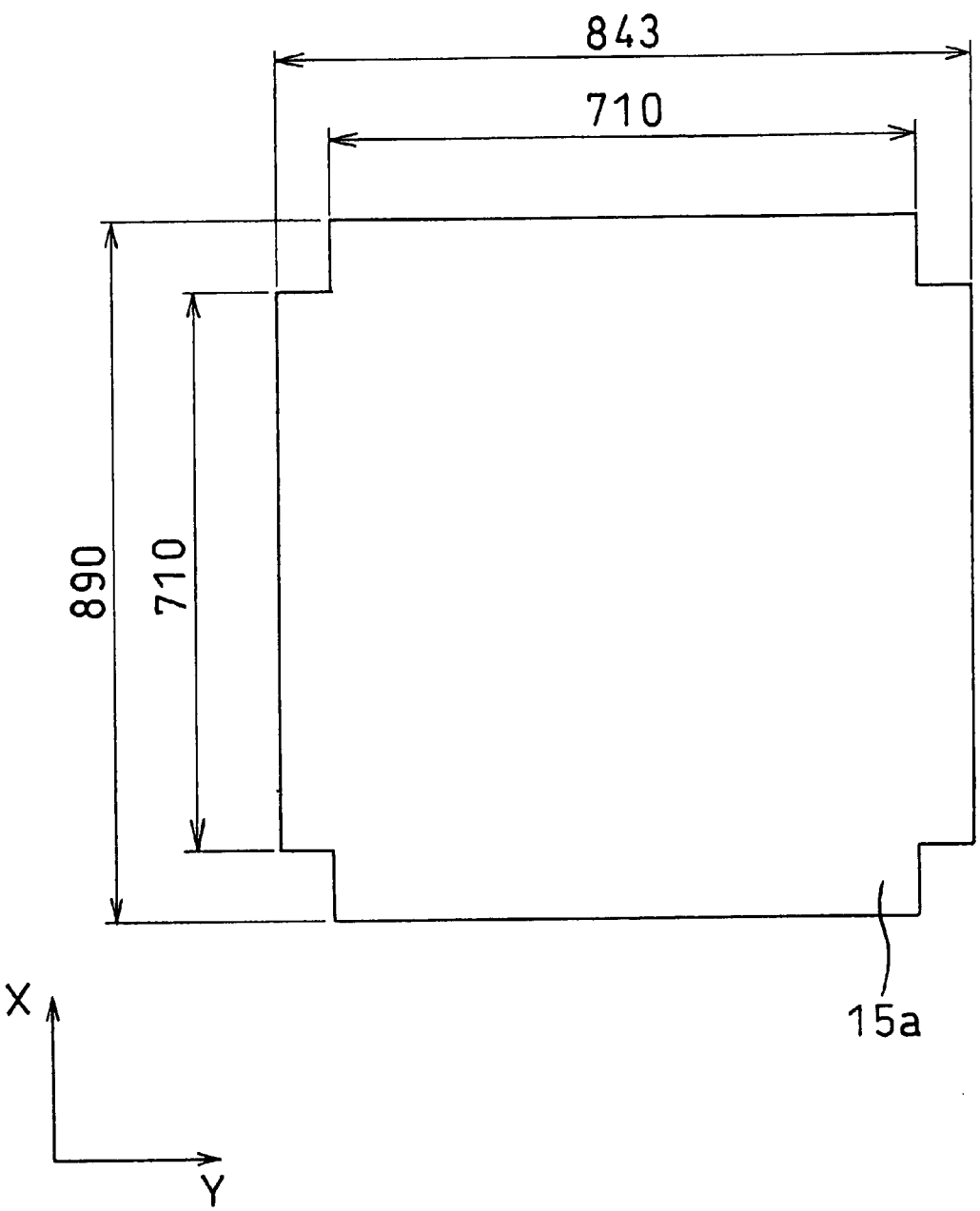
FIG. 13 is a schematic view showing a size of a substrate holder.
Figure 14:
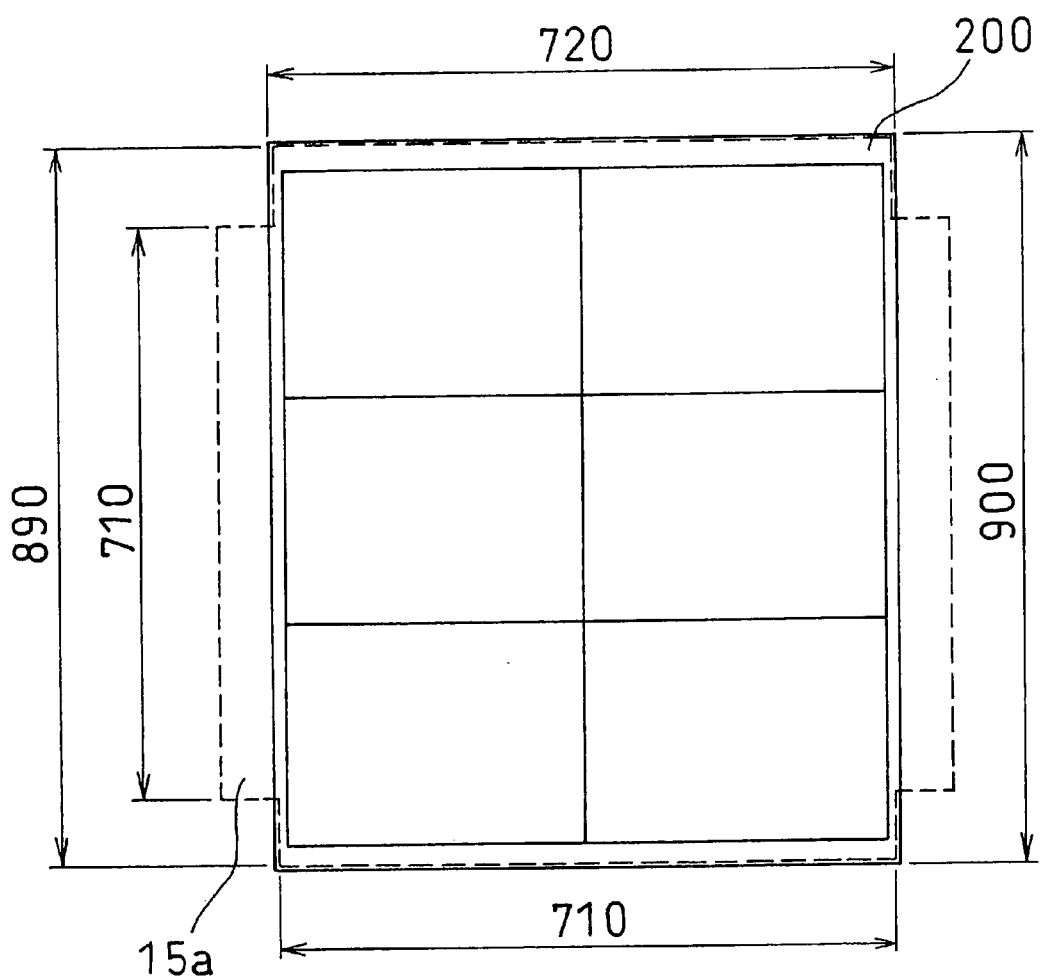
FIG. 14 is a schematic view showing a substrate loaded on a substrate holder.
Figure 15:
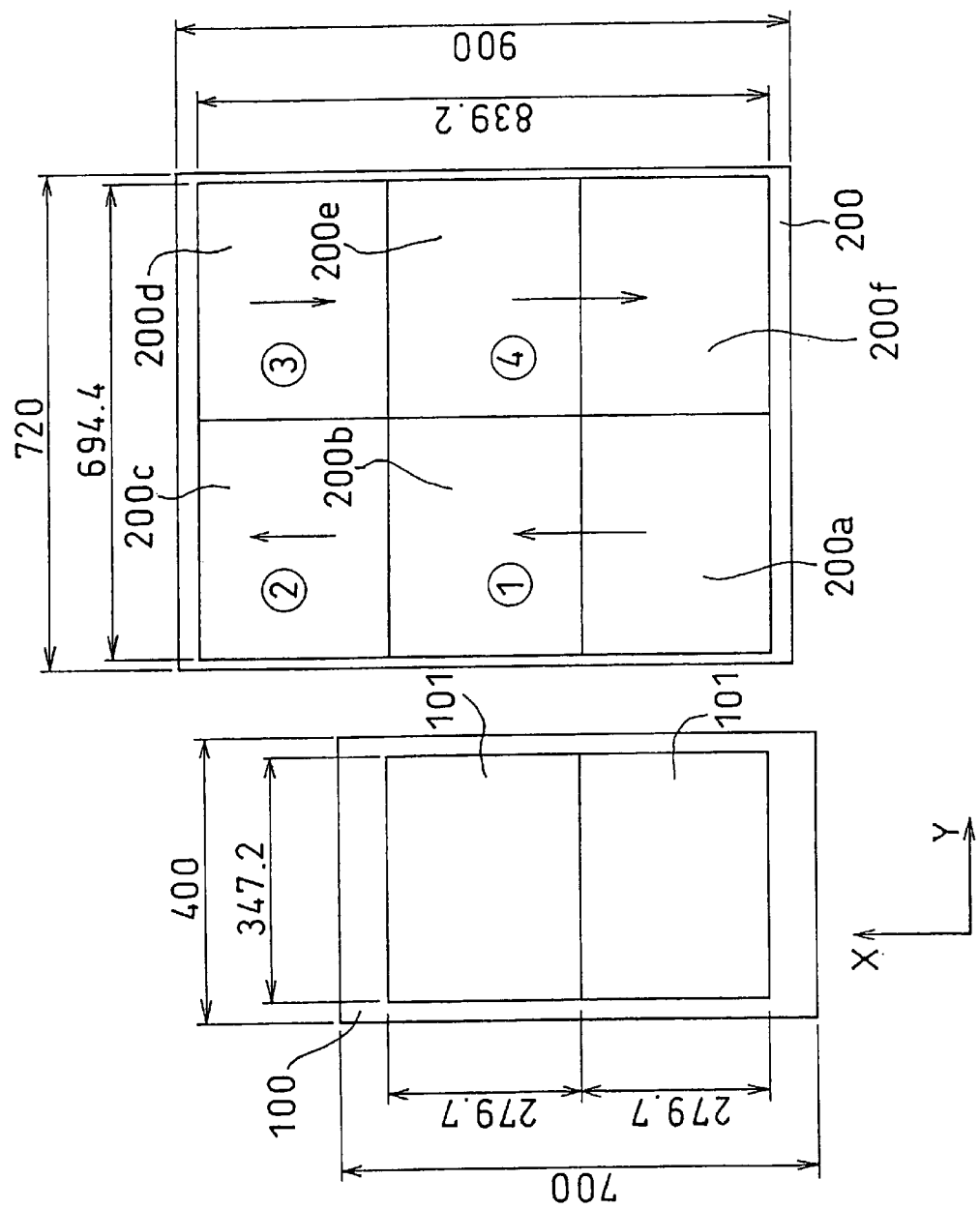
FIG. 15 is a schematic view for illustrating a manner of printing six 17-inch SXGA LCD panels on a substrate.

The substrate 14 is adsorbed (e.g., by vacuum holding) on the substrate holder 15a on a substrate stage 15. According to this embodiment, the size of the rectangular substrate holder 15a is 843 mm×890 mm which is equivalent to the size of the prior art substrate holder shown in FIG. 13. The substrate 14 is adsorbed by the entire surface of the substrate holder 15a.

The substrate stage 15 has an X-direction driving device 16X which gives a long stroke along the scanning direction (X-direction) for one-dimensional scanning exposure. The substrate stage 15 also has a highly-accurate high-resolution X-direction position detecting device (e.g., a laser interferometer) 17X with respect to the scanning direction. The mask 10 is supported by a mask stage 20 which also has an X-direction driving device 18X which gives a long stroke along the scanning direction (X-direction) and an X-direction position detecting device 19X for detecting the position of the mask stage along the scanning direction.

Furthermore, the substrate stage 15 is capable of being step transferred in the Y-direction which is generally perpendicular to the X-direction (the scanning direction). Specifically, the substrate stage 15 is provided with a Y-direction driving device 16Y for driving the substrate stage 15 in the Y-direction, and a Y-direction position detecting device 17Y. The substrate stage 15 is step transferred by the Y-direction driving device 16Y for a distance SP which is longer than the length of the illuminated areas 11a to 11e along the Y-direction.

A controller 50 controls the whole scanning-type exposure apparatus. The results obtained with the position detecting devices 17X, 17Y and 19X, and the alignment outputs from alignment systems 20a and 20b are input into the controller 50. The controller 50 is also provided with a storage memory 51. Moreover, the controller 50 also controls adsorption by a plurality of adsorbing regions formed on the substrate holder 15a (as will be described later in detail).

Figure 2:
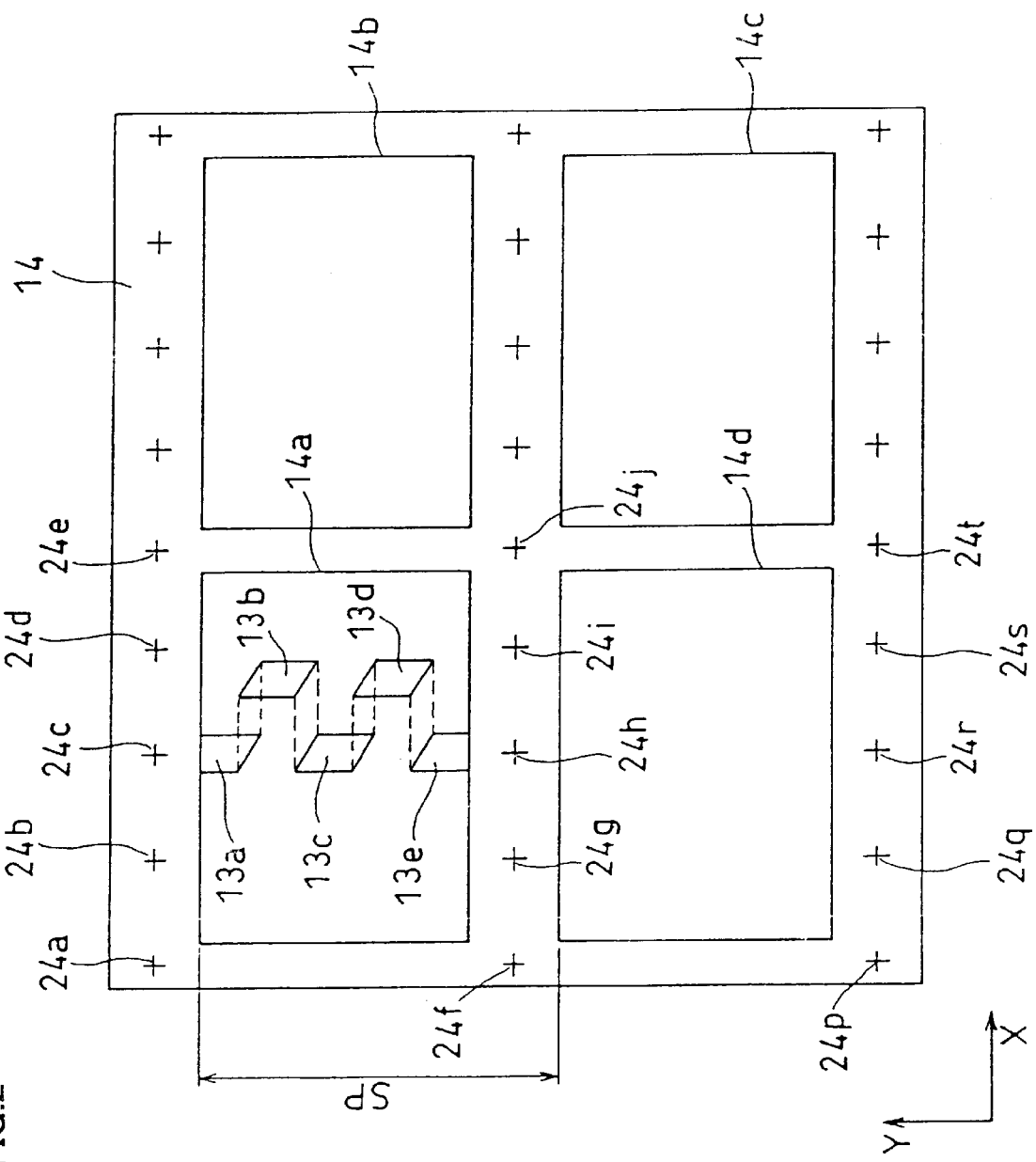
FIG. 2 is a plan view showing a substrate loaded on a substrate stage.

FIG. 2 is a plan view showing a substrate 14 loaded on the substrate stage 15. As shown in FIG. 2, the projection regions 13a to 13c on the substrate 14 are arranged such that regions adjacent along the Y-direction (e.g., regions 13a and 13b, and regions 13b and 13c) are shifted for a predetermined length along the X-direction and the ends of the adjacent regions along the Y-direction overlap as represented by dotted lines. Accordingly, in accordance with the projection regions 13a to 13e, the multiple projection optical systems 12a to 12e are also shifted for a predetermined distance along the X-direction while the adjacent ends thereof overlap along the Y-direction. Although the shapes of the projection regions 13a to 13e are parallelograms in the figure, they may be hexagons, rhombuses, trapezoids or the like. The multiple illuminating optical systems L1 to L5 are arranged such that the illuminated areas 11a to 11e on the mask 10 match with the above-described projection regions 13a to 13e. The substrate 14 is provided with alignment marks (substrate marks) 24a, 24b, 24c, . . . , 24f, 24g, 24h, . . . , 24p, 24q, 24r, . . . outside the exposure areas 14a, 14b, 14c and 14d.

Figure 3:
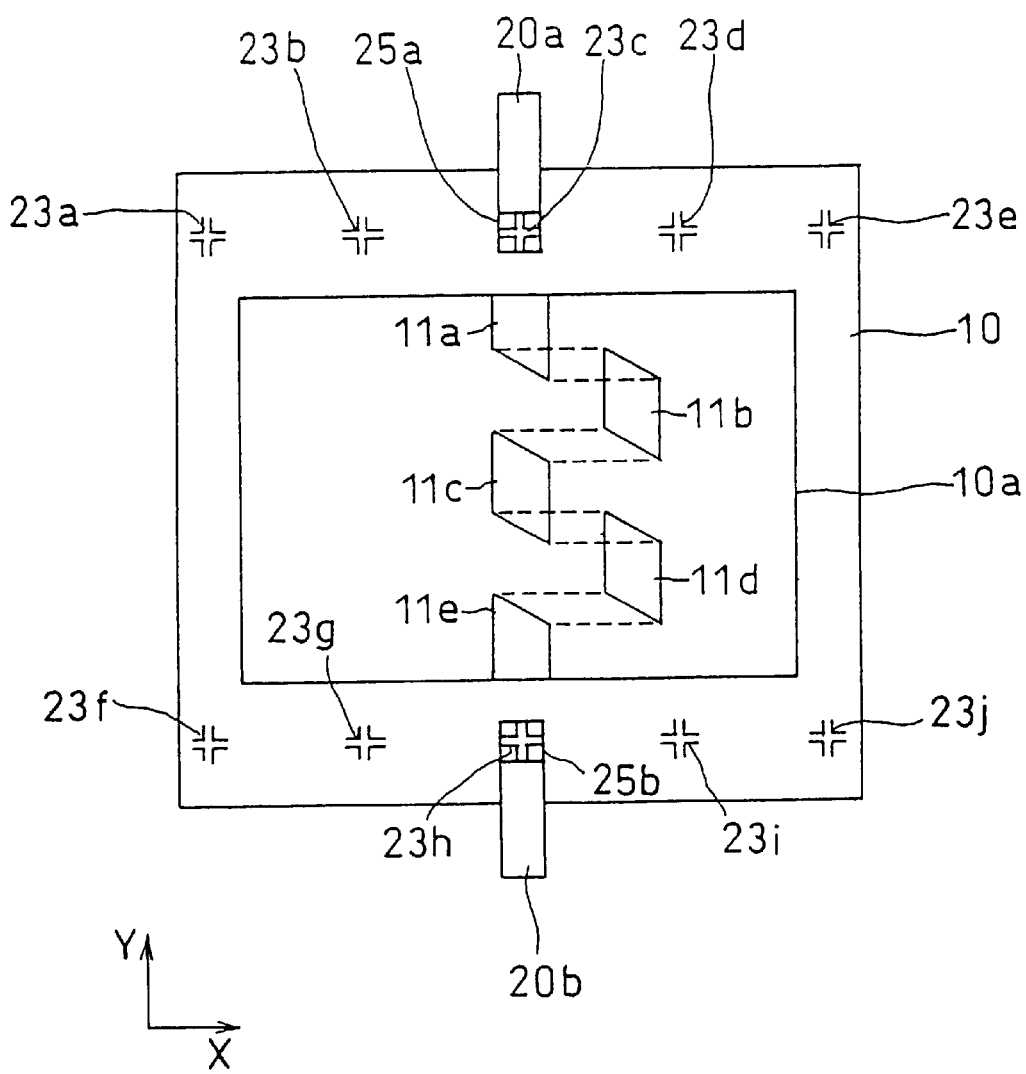
FIG. 3 is a plan view showing a mask.

FIG. 3 is a plan view of the mask 10 showing a pattern region 10a having a pattern to be printed on the substrate 14. Outside the pattern region 10a, the mask 10 is provided with alignment marks (mask marks) 23a to 23j corresponding to the substrate marks 24a, 24b, 24c, . . . , 24f, 24g, 24h, . . . , 24p, 24q, 24r, . . . on the substrate 14.

As can be appreciated from FIGS. 1 and 3, the alignment systems 20a and 20b are provided above the mask 10, for detecting the mask marks 23a to 23j on the mask 10 as well as the substrate marks 24a, 24b, 24c, . . . , 24f, 24g, 24h, . . . , 24p, 24q, 24r, . . . formed on the substrate 14, via the projection optical systems 12a and 12e. Specifically, light beams outcoming from the alignment systems 20a and 20b are directed toward the mask marks 23a to 23j formed on the mask 10 via the reflecting mirrors 25a and 25b, and toward the substrate marks 24a, 24b, 24c, . . . , 24f, 24g, 24h . . . (24f, 24g, 24h, . . . , 24p, 24q, 24r, . . . ) on the substrate 14 via the optical systems 12a and 12e at both ends of the multiple projection optical systems 12a to 12e.

The light reflected off the substrate marks 24a, 24b, 24c, . . . , 24f, 24g, 24h, . . . (24f, 24g, 24h, . . . , 24p, 24q, 24r, . . . ) formed on the substrate 14 is directed to the alignment systems 20a and 20b via the projection optical systems 12a and 12e and the reflecting mirrors 25a and 25b. The light reflected off the mask marks 23a to 23j formed on the mask 10 is directed to the alignment systems 20a and 20b via the reflecting mirrors 25a and 25b. The alignment systems 20a and 20b detect the position of each alignment mark based on the reflected light from the mask 10 and the substrate 14.

While transferring the mask stage 20 and the substrate stage 15 along the X-direction, the alignment detection systems 20a and 20b simultaneously detect the substrate marks 24a, 24b, 24c, . . . , 24f, 24g, 24h, . . . (24f, 24g, 24h, . . . , 24p, 24q, 24r, . . . ) on the substrate 14 and the mask marks 23a to 23j on the mask 10, thereby detecting the relative positions of the substrate 14 and the mask 10.

The scanning-type exposure apparatus is capable of step transferring the substrate stage 15 along the Y-direction (which is generally perpendicular to the X-direction, or the scanning direction) for a distance SP which is at least longer than the width of the illuminated areas 11a to 11e along the Y-direction. After the scanning exposure by synchronously driving the mask stage 20 and the substrate stage 15 along the X-direction, the scanning exposure is performed once more or for several times by step transferring the substrate stage 15 along the Y-direction for a distance SP to print an array of multiple mask patterns 10a onto a large substrate 14.

Figure 4:
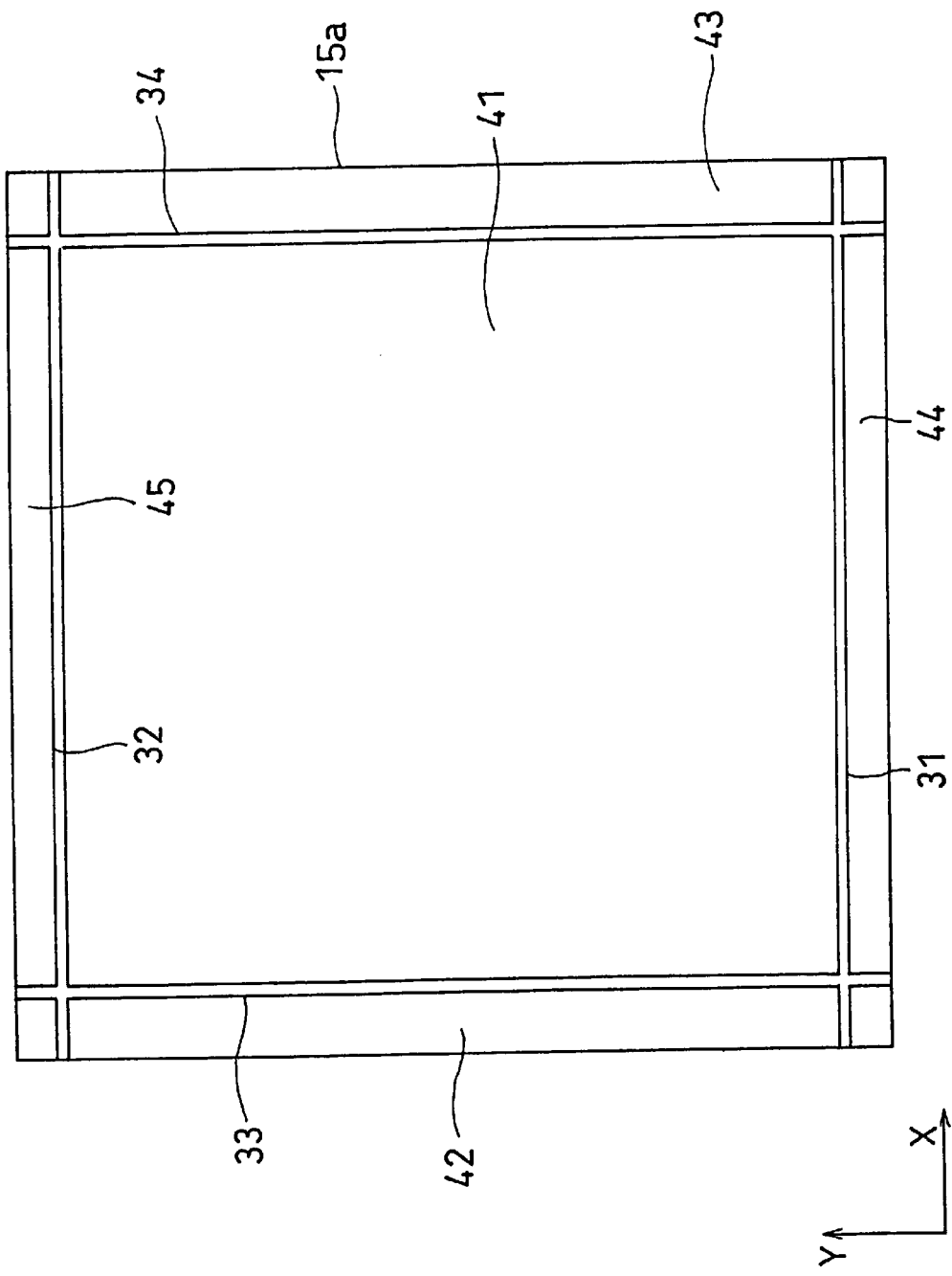
FIG. 4 is a plan view showing an example of a substrate holder.

FIG. 4 is a plan view showing an example of the substrate holder 15a. This exemplary substrate holder 15a has a rectangular shape where the sides along the X-direction are longer than the sides along the Y-direction. The substrate holder 15a is held by the substrate stage 15 to be scanned in the X-direction (the first direction). The substrate-holding surface of the substrate holder 15a is provided with a pair of parallel grooves 31 and 32 extending in the scanning direction (X-direction in the figure), and a pair of parallel grooves 33 and 34 extending in the direction (Y-direction in the figure) generally perpendicular to the scanning direction. These grooves 31, 32, 33 and 34 define a center region 41, a left region 42, a right region 43, a lower region 44 and an upper region 45. The regions 41 to 45 are provided with a number of distributed vacuum pores for vacuum holding the loaded substrate 14.

Figure 5:
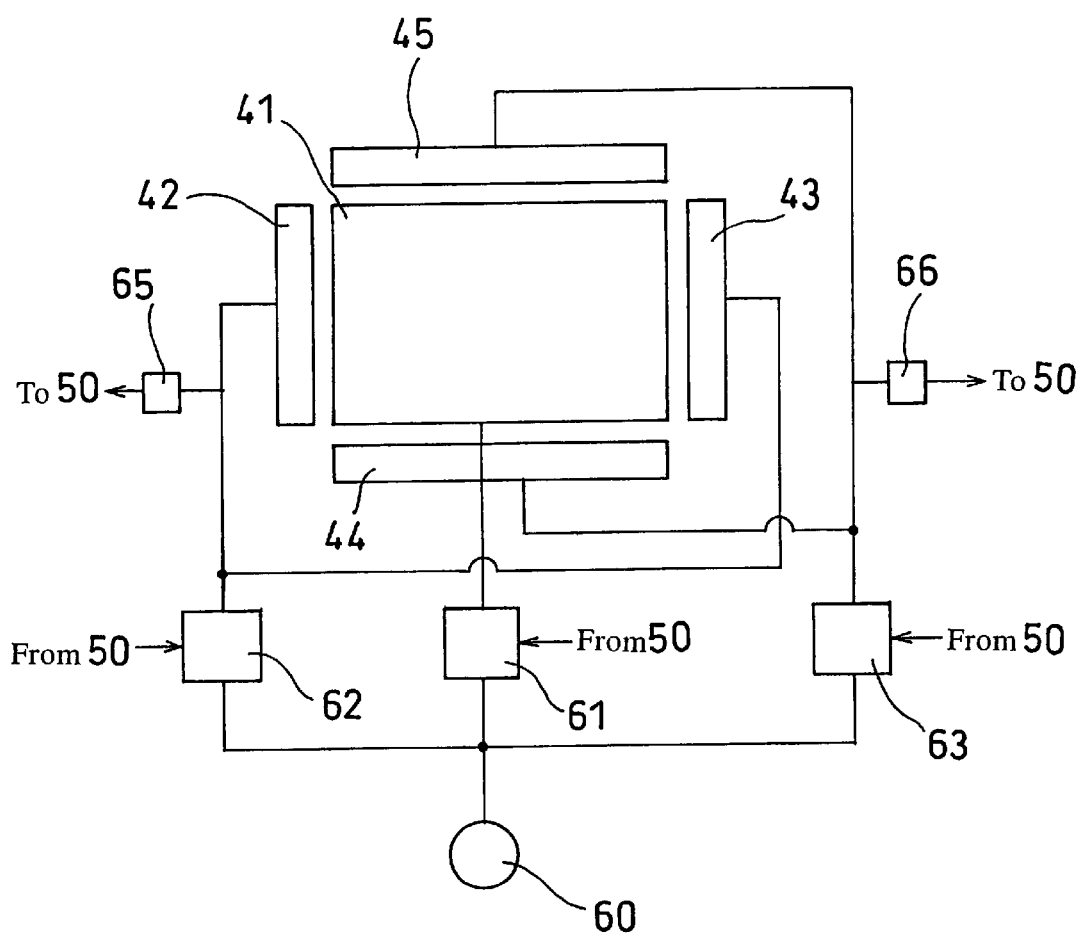
FIG. 5 is a diagram showing an evacuation system connected to the substrate holder.

FIG. 5 is a diagram showing an evacuation system connected to the substrate holder 15a for vacuum holding the substrate by selectively evacuating the vacuum pores provided over each regions 41 to 45 of the substrate-holding surface of the substrate holder 15a. A vacuum source 60 such as a vacuum pump is connected to the vacuum pores distributed over the center region 41 via an electromagnetic valve 61, to the vacuum pores distributed over the left and right regions 42 and 43 via an electromagnetic valve 62, and to the vacuum pores distributed over the lower and upper regions 44 and 45 via an electromagnetic valve 63. The electromagnetic valves 61 to 63 are opened or closed by the controller 50. A vacuum sensor 65 is provided in the middle of a line connecting the electromagnetic valve 62 to the left and right regions 42 and 43 of the substrate holder 15a. A vacuum sensor 66 is provided in the middle of a line connecting the electromagnetic valve 63 to the lower and upper regions 44 and 45 of the substrate holder 15a. The outputs from the vacuum sensors 65 and 66 are input into the controller 50.

Figure 6:
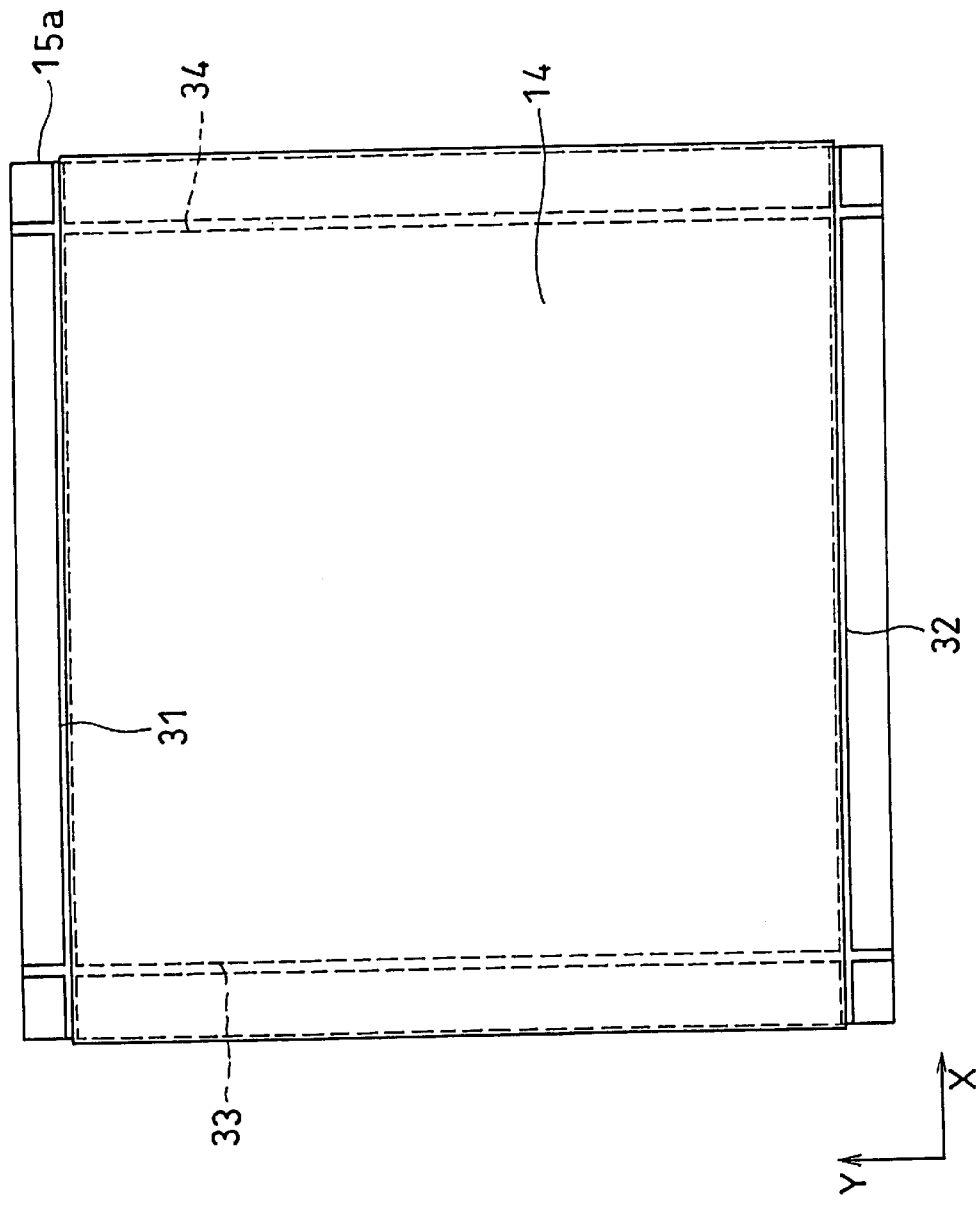
FIG. 6 is a schematic plan view for illustrating an example of a method for loading the substrate on the substrate holder.

FIG. 6 is a schematic plan view for illustrating an example of a method for loading the substrate 14 on the substrate holder 15a according to this embodiment. According to this example, the rectangular substrate 14 is loaded on the substrate holder 15a such that the longer sides of the substrate 14 are arranged in parallel to the longer sides of the substrate holder 15a (in the figure, along the X-direction, or the scanning direction). The edges along the longer sides of the substrate 14 are placed along the pair of grooves 31 and 32 provided in the substrate-holding surface of the substrate holder 15a.

The controller 50 opens the electromagnetic valves 61 and 62 and closes the electromagnetic valve 63 of the evacuation system shown in FIG. 5. As a result, the vacuum pores distributed over the center region 41, X_ region 42 and the X_+ region 43 of the substrate holder 15a are evacuated to vacuum hold the substrate 14 on the substrate-holding surface of the substrate holder 15a. The controller 50 monitors the outputs from the vacuum sensors 65 and 66 to see whether the substrate 14 is loaded on a predetermined position of the substrate holder 15a. Specifically, if the vacuum sensor 65 senses vacuum and the vacuum sensor 66 senses atmospheric pressure, the substrate 14 is judged that it has been loaded on the predetermined position where its longer sides are in parallel to the longer sides of the substrate holder 15a as shown in FIG. 6 (in parallel to the substrate-scanning direction). On the other hand, when the vacuum sensor 65 does not indicate a vacuum state, the substrate 14 is judged that it is not on the predetermined position for a reason such as a shift on the substrate holder 15a.

Figure 7:
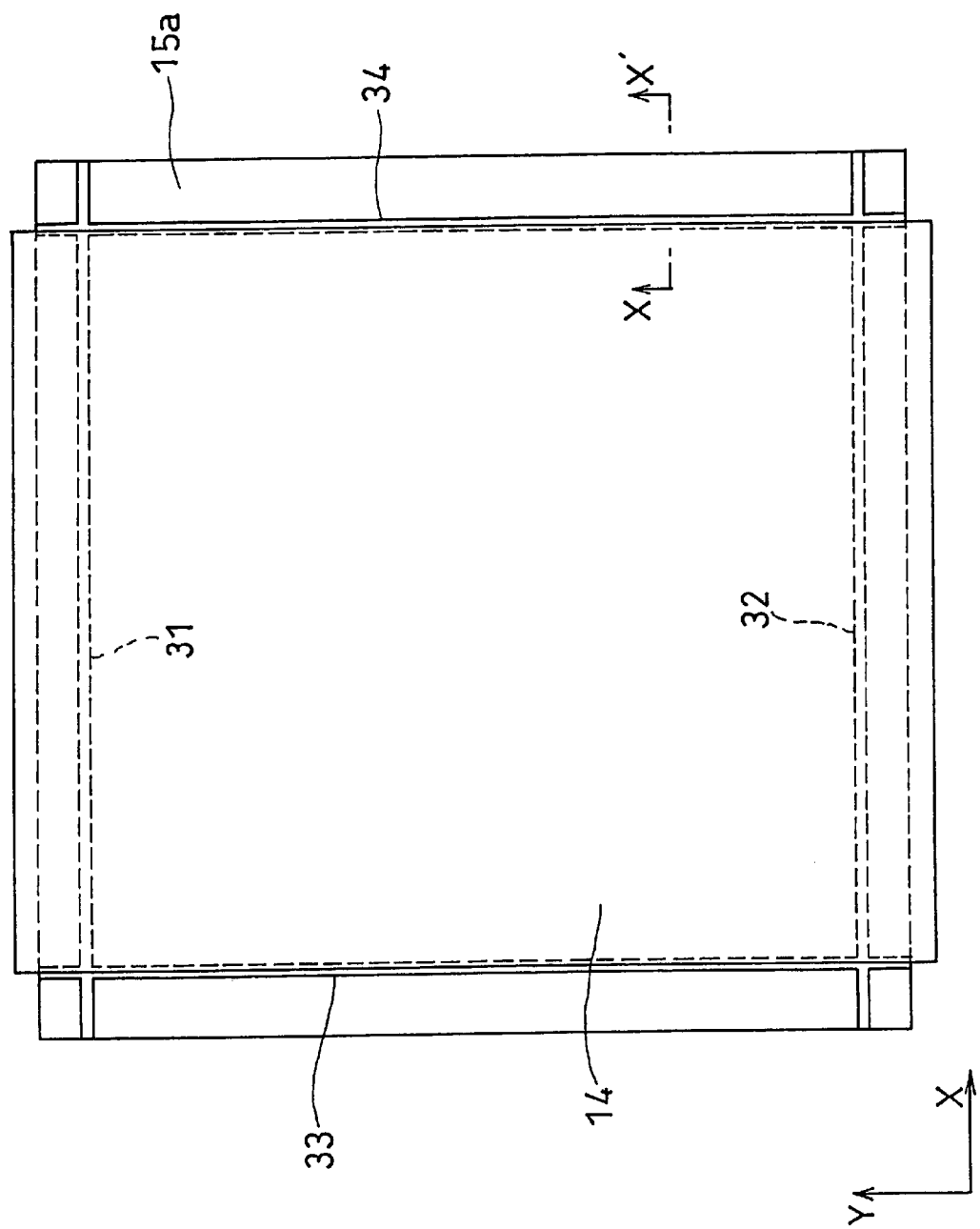
FIG. 7 is a schematic plan view for illustrating an example of another method for loading the substrate on the substrate holder.

FIG. 7 is a schematic plan view for illustrating an example of another method for loading the substrate 14 on the substrate holder 15a according to the present embodiment. According to this example, the rectangular substrate 14 is loaded on the substrate holder 15a such that the longer sides of the substrate 14 are arranged in parallel to a direction (in the figure, the Y-direction) perpendicular to the longer sides of the substrate holder 15a. The substrate 14 is loaded such that the edges along the longer sides of the substrate 14 are placed along the pair of grooves 33 and 34 provided in the substrate-holding surface of the substrate holder 15a in the Y-direction. When the longer sides of the rectangular substrate 14 are longer than the shorter sides of the rectangular substrate holder 15a, the ends of the longer sides of the substrate 14 project out from the substrate holder 15a as shown in FIG. 7. However, there is no problem as long as the areas of the substrate 14 projecting out from the substrate-holding surface of the substrate holder 15a are not targets of exposure to the pattern of the mask 10. There is no need of precisely controlling the flatness of the non-exposed areas of the substrate 14.

The controller 50 opens the electromagnetic valves 61 and 63 and closes the electromagnetic valve 62 of the evacuation system shown in FIG. 5. As a result, the vacuum pores distributed over the center region 41, the lower region 44 and the upper region 45 of the substrate holder 15a are evacuated to vacuum hold the substrate 14 on the substrate-holding surface of the substrate holder 15a. The controller 50 monitors the outputs from the vacuum sensors 65 and 66 to see whether the substrate 14 is loaded on a predetermined position of the substrate holder 15a. Specifically, if the vacuum sensor 66 senses vacuum and the vacuum sensor 65 senses atmospheric pressure, the substrate 14 is judged that it has been loaded on the predetermined position where its shorter sides are in parallel to the longer sides of the substrate holder 15a as shown in FIG. 7 (in parallel to the substrate-scanning direction). On the other hand, when the vacuum sensor 66 does not indicate a vacuum state, the substrate 14 is judged that it is not on the predetermined position for a reason such as a shift on the substrate holder 15a.

Figure 8:
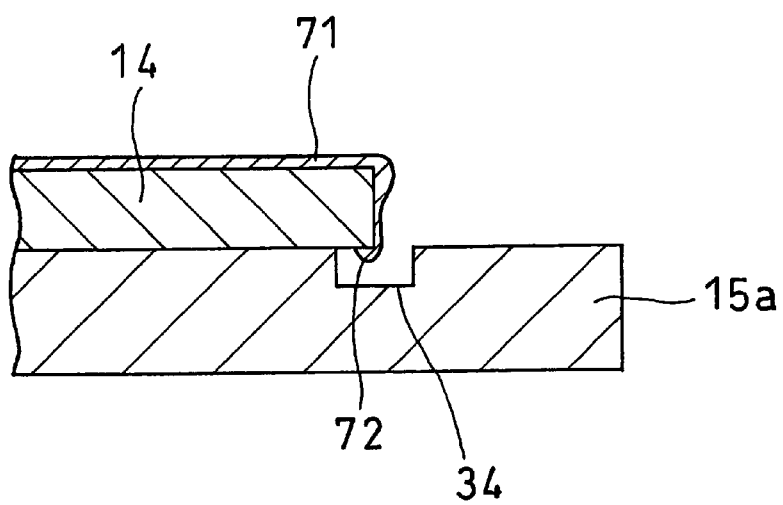
FIG. 8 is a schematic cross-sectional view taken along line X—X of FIG. 7.

FIG. 8 is a schematic cross-sectional view taken along line X–X' of FIG. 7. With reference to FIG. 8, function of the grooves provided in the substrate-holding surface of the substrate holder 15a will be described. According to this embodiment, the substrate 14 is loaded on the substrate holder 15a such that the periphery of the substrate 14 is positioned along the grooves 31, 32; 33, 34. The surface of the substrate 14 is applied with a photoresist 71. When the photoresist 71 is applied on the substrate 14 with a spin coater or the like, the resist often leaks into the periphery of the back surface of the substrate 14. If such substrate 14 with the resist 72 on its back is directly loaded on the substrate holder 15a, the substrate-holding surface of the substrate holder 15a may not contact closely to the back surface of the substrate 14 due to the resist 72, causing a problem of poor flatness of the exposure area. Moreover, the leaked resist 72 on the back surface of the substrate 14 contaminates the substrate-holding surface of the substrate holder 15a. However, by providing the grooves 31, 32; 33, 34 in the substrate-holding surface of the substrate holder 15a and by loading the substrate 14 on the substrate holder 15a such that the periphery of the substrate 14 is positioned along the grooves 31, 32; 33, 34, the resist 72 leaking around the substrate 14 will be led into the grooves (as groove 34 shown in FIG. 8). As a result, deterioration of the flatness of the substrate 14 and contamination of the substrate-holding surface of the substrate holder 15a are prevented, maintaining good flatness.

Figure 9:
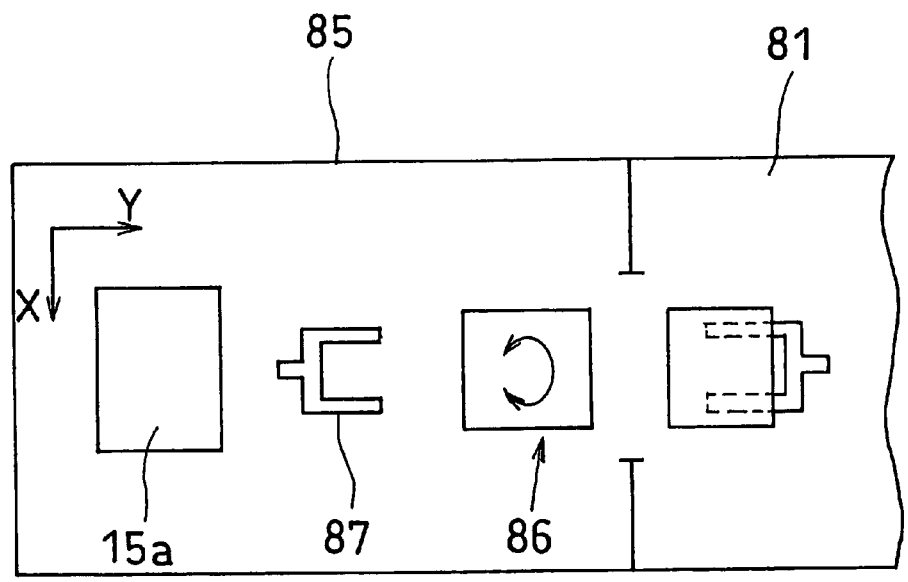
FIG. 9 is a schematic view for illustrating transportation of the substrate from a coater developer to an exposure apparatus.

FIG. 9 is a schematic view for illustrating transportation of the substrate 14 from a coater developer 81 to the exposure apparatus. The coater developer 81 transfers the substrate 14 applied with the resist with a transportation arm 82 to give it to the exposure apparatus 85. In the exposure apparatus 85, the substrate 14 given from the coater developer 81 is once loaded on a rotary table 86. The rotary table 86 gives the substrate 14 to a substrate loader 87 directly or after rotating the substrate 14 by 90o, depending on whether the longer sides of the substrate 14 are to be placed in parallel to the longer sides of the substrate holder 15a (placed along the scanning direction, or the X-direction) as shown in FIG. 6 or in parallel to the direction (the Y-direction) perpendicular to the longer sides of the substrate holder 15a as shown in FIG. 7. The substrate loader 87 of the exposure apparatus 85 receives the substrate 14 from the rotary table 86 and loads it on the substrate holder 15a.

The storage memory 51 of the controller 50 stores a recipe including data such as a position of the substrate 14 on the substrate holder 15a, a scanning length for the scanning exposure, a scanning rate, and a distance of a transversal step. Based on this recipe, the controller 50 controls: the rotation of the rotary table 86; synchronized scan of mask 10 and the substrate 14 for the scanning exposure using the X-direction driving device 18X for the mask stage 20 and the X-direction driving device 16X for the substrate stage 15; the stepwise transportation of the substrate stage 15 in the Y-direction with the Y-direction driving device 16X; and the like.

Hereinafter, a method will be described for printing six 17-inch SXGA patterns, each having a size of 279.7 mm×347.2 mm including a circuitry pattern surrounding a pixel region, on the substrate 14.

As described above, the size of the substrate holder 15a is 843 mm×890 mm and the size of the substrate 14 is 720 mm×900 mm, where the longer sides of the substrate 14 are longer than the shorter sides of the substrate holder 15a. Moreover, instead of the mask 10, a mask 30 is used which is printed with two 17-inch SXGA patterns 30a. The effective exposure area of the mask 30 is 400 mm×700 mm which is the same as that of the mask 10. The mask 30 is provided with mask marks (omitted in the figure) similar to those on the mask 10.

Figure 10:
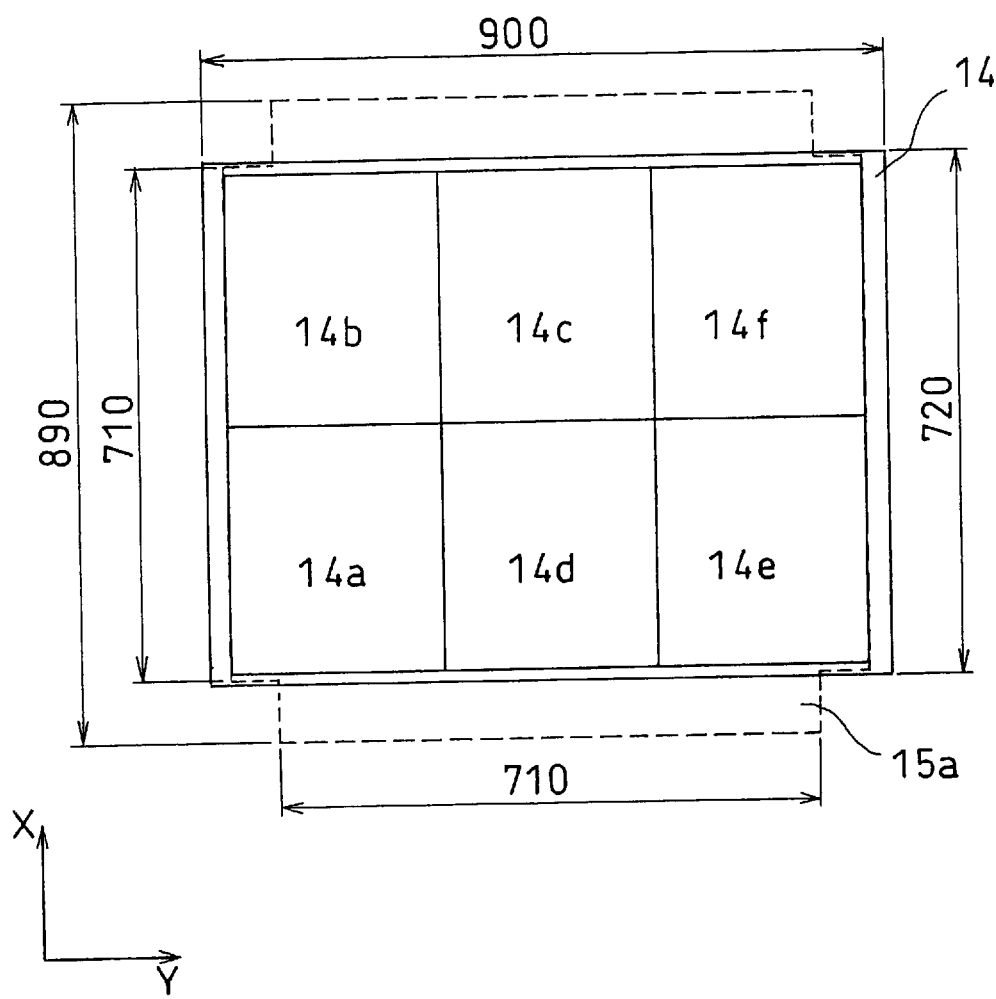
FIG. 10 is a schematic plan view showing a substrate supported by a substrate holder.

FIG. 10 is a schematic plan view showing a substrate 14 supported by the substrate holder 15a (which is represented by dotted lines in FIG. 10 for distinction from the substrate 14).

As shown in FIG. 10, in order to expose the 17-inch SXGA patterns onto the substrate 14, the substrate 14 is loaded on the substrate holder 15a such that the longer sides of the substrate 14 are in parallel to the shorter sides of the substrate holder 15a (i.e., the substrate 14 is rotated by 90o from the position shown in FIG. 1).

Although the ends of the longer sides of the substrate 14 project out from the substrate holder 15a, the exposure areas 14a to 14f of the substrate 14 are supported by (in contact with) the substrate holder 15a via the above-described evacuation. Since the flatness of the exposure areas 14a to 14f are precisely maintained by evacuation, the patterns 30a of the mask 30 can accurately be printed onto the exposure areas 14a to 14f of the substrate 14. Although they are not shown in the figure, alignment marks are formed on the substrate 14 at positions corresponding to the vacuum holding regions of the substrate holder 15a for alignment of the substrate 14.

Figure 11:
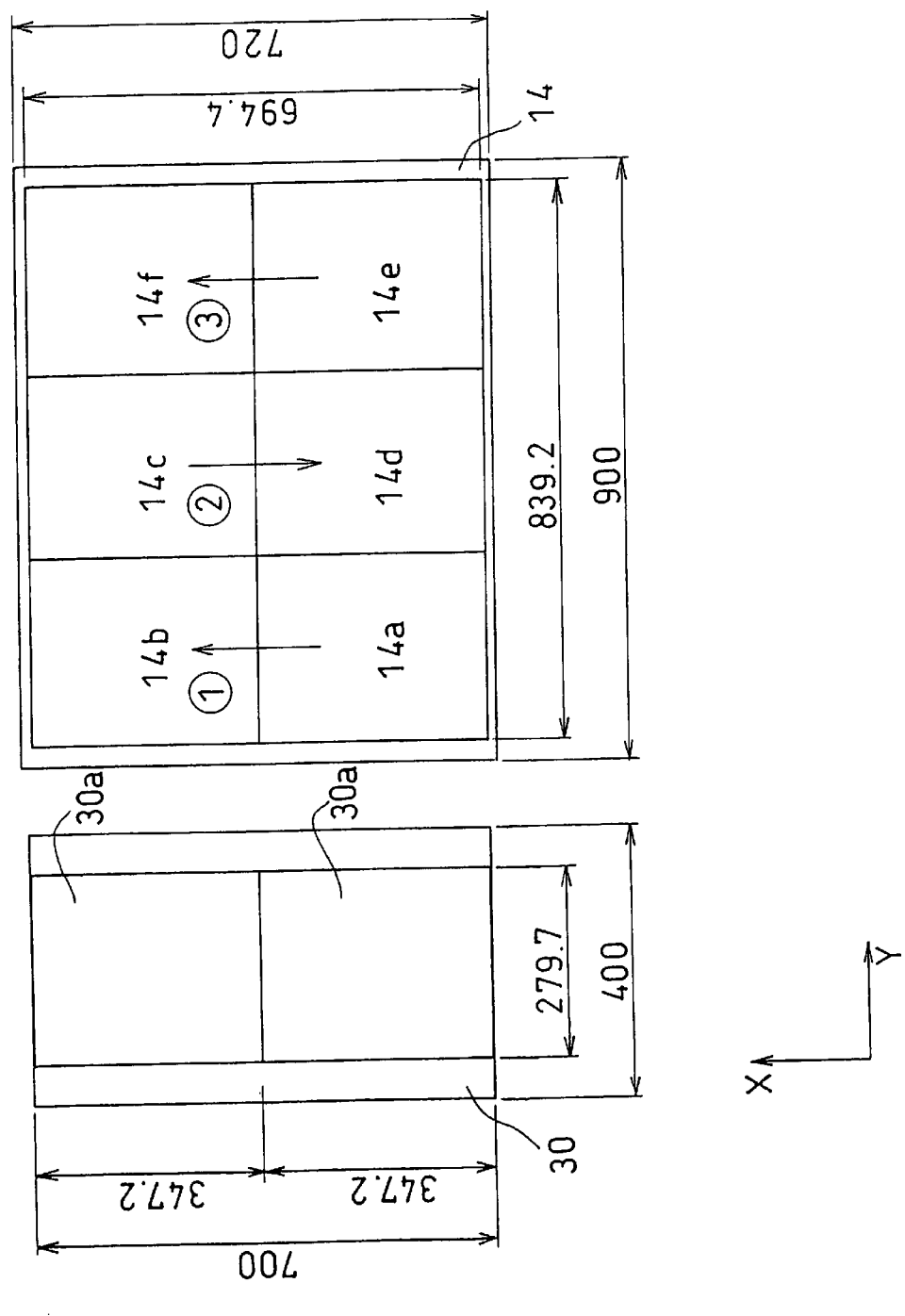
FIG. 11 is a schematic plan view showing a manner of printing six 17-inch SXGA LCD panels on the substrate.

FIG. 11 is a schematic plan view showing a method for printing six 17-inch SXGA panels on the substrate 14, by using a mask 30 which has two 347.2 mm×279.7 mm circuit patterns 30a formed thereon. In FIG. 11, the substrate holder 15a is omitted.

As shown in FIG. 11, the size of the mask 30 is the same as that of the prior art mask 100, although the direction of the pattern 30a is shifted by 90o from that of the pattern 101 of the mask 100. In other words, the longer sides of the pattern 30a of the mask 30 are in parallel to the longer sides of the mask 30.

Figure 12:
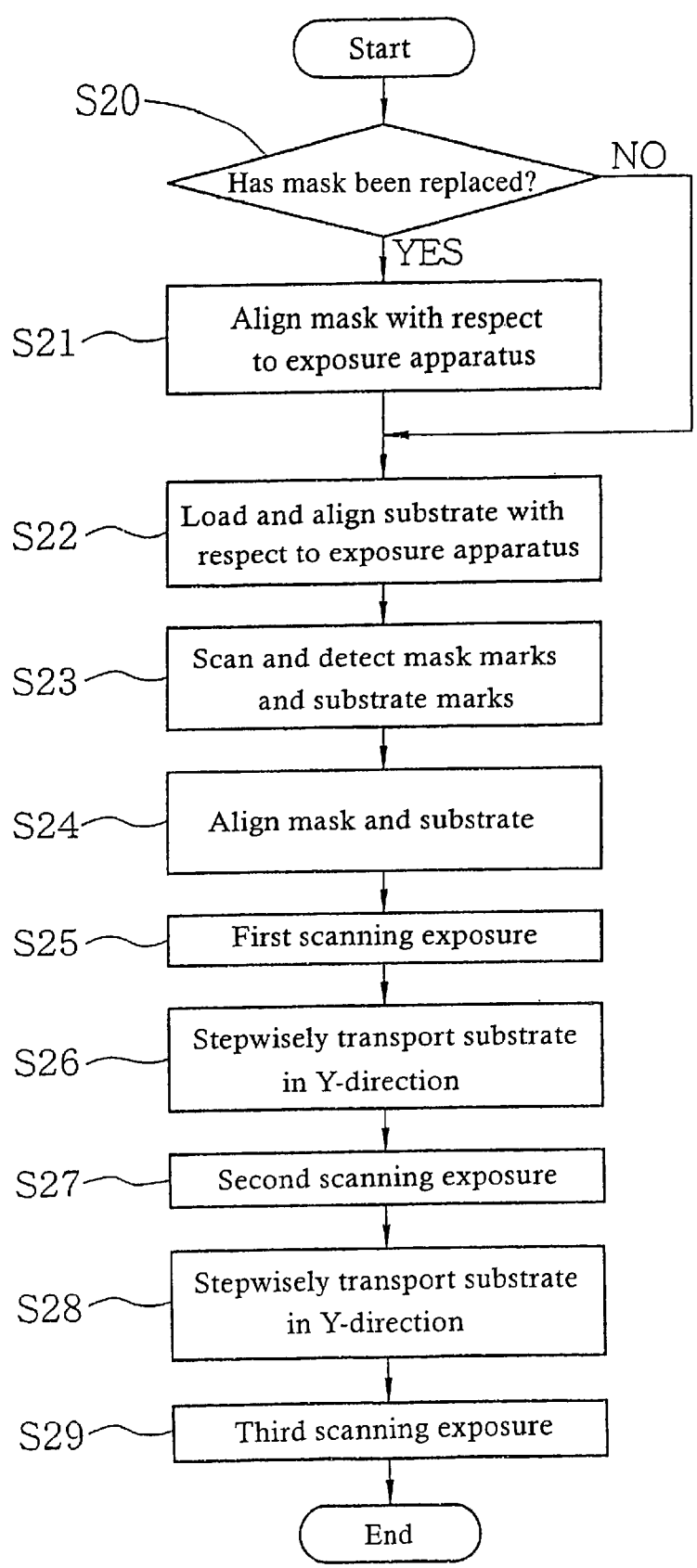
FIG. 12 is a flowchart showing an exemplary sequence of steps for scanning exposure.

Hereinafter, an exemplary sequence of steps for scanning exposure with the controller 50 will be described with reference to the flowchart shown in FIG. 12.

The controller 50 controls a mask loader (not shown) to replace the mask 10 on the mask stage 20 with the mask 30 which is provided with two 17-inch SXGA patterns 30a (Step 20).

When the answer in Step 20 is "YES", the controller 50 proceeds to Step 21 to align the mask 30 with respect to the exposure apparatus, using the alignment systems 20a and 20b supported by a supporting member supporting the projection optical systems 12a to 12e. The alignment systems 20a and 20b perform alignment by adjusting the position of the mask stage 20 such that the positions of the mask marks are in a predetermined relationship with the index marks in the alignment systems 20a and 20b (Step 21). When there is no need of replacing the mask, Step 21 is omitted.

Next, the controller 50 loads the substrate 14 that is to be exposed onto the substrate holder 15a on the substrate stage 15 by using a substrate loader (not shown), and positions the loaded substrate 14 with respect to the exposure apparatus such that the longer sides of the substrate 14 are in parallel to the shorter sides of the substrate holder 15a (Step 22). Specifically, similar to the alignment of the mask 30 at Step 21, the substrate stage 15 is driven by detecting the substrate marks with the alignment systems 20a and 20b such that the positions of the substrate marks are in a predetermined relationship with the index marks in the alignment systems 20a and 20b.

The controller 50 synchronously scans the mask 30 and the substrate 14 with respect to the projection optical systems 12a to 12e by driving the mask stage 20 and the substrate stage 15, for example, in the −X-direction, by the X-direction driving device 18X for the mask stage 20 and the X-direction driving device 16X for the substrate stage 15. One of the alignment systems 20a and 20b detects relative positions of the mask marks and the substrate marks upon synchronous scanning. The relative positions of the detected mask marks and the substrate marks upon synchronous scanning are stored in the storage medium 51 (Step 23).

After the mask 30 and the substrate 14 are scanned, the mask 30 and the substrate 14 are aligned at the scan initiating positions where the mask 30 and the substrate 14 are completely dislocated from the illuminated areas 11a to 11e and the projection regions 13a to 13e, respectively (Step 24). The alignment at Step 24 is performed by calculating, by the least square method, the transportation distances of the mask 30 in the X-direction, Y-direction and the rotation direction such that the relative position errors between the mask marks and the corresponding substrate marks (which are detected during the scanning at Step 23 and stored in the storage medium 51) are minimum, and in accordance with the results, by adjusting the position of the mask 30 on the mask stage 20.

The controller 50 prints the two patterns 30a of the mask 30 on the projection regions 14a and 14b of the substrate 14 as represented by the arrow 1 in FIG. 11 by the first scanning exposure where the mask stage 20 and the substrate stage 15 are synchronously scanned in the +X-direction (Step 25).

After the first scanning exposure, the controller 50 drives the Y-direction driving device 16Y to stepwisely transport the substrate 14 in the Y-direction. The distance of a single step transportation is generally equal to the length of the shorter side of the 17-inch SXGA LCD panel (279.7 mm in the figure) (Step 26).

The controller 50 prints the two patterns 30a of the mask 30 on the projection regions 14c and 14d of the substrate 14 as represented by the arrow 2 in FIG. 11 by the second scanning exposure where the mask stage 20 and the substrate stage 15 are synchronously scanned in the −X-direction (Step 27).

After the second scanning exposure, the controller 50 drives the Y-direction driving device 16Y to stepwisely transport the substrate 14 in the Y-direction. The distance of a single step transportation is the same as Step 26 and is generally equal to the length of the shorter side of the 17-inch SXGA LCD panel (279.7 mm in the figure) (Step 28).

The controller 50 prints the two patterns 30a of the mask 30 on the projection regions 14e and 14f of the substrate 14 as represented by the arrow 3 in FIG. 11 by the third scanning exposure where the mask stage 20 and the substrate stage 15 are synchronously scanned in the +X-direction (Step 25).

When six 17-inch SXGA LCD panels are to be printed, the prior art required scanning exposures for four times. On the other hand, according to the embodiment of the present invention, six 17-inch SXGA LCD panels can be printed by scanning exposures for three times since the substrate 14 is loaded on the substrate holder 15a such that the longer sides of the substrate 14 are arranged in parallel to the shorter sides of the substrate holder 15a.

In order to simplify the description of the present embodiment, the sizes of the mask 30, the substrate 14 and the substrate holder 15a are specialized herein. The present embodiment, however, is not limited to these sizes and can broadly be applied to devices of various sizes as long as the substrate holder 15a is loaded on the substrate 14 such that the longer sides of the substrate 14 are arranged in parallel to the shorter sides of the substrate holder 15a.

According to the present invention, an exposure apparatus is provided in which the flatness of the substrate is not deteriorated even when a resist on a substrate leaks into the periphery of the back surface, nor a substrate-holding surface is contaminated with the resist. The present invention further provides an exposure apparatus which is small, and at the same time has enhanced throughput requiring less number of scan steps.

What is claimed is:

1. An exposure apparatus that exposes a pattern of a mask onto a substrate, comprising:

a substrate holder having a substrate-holding surface to hold the substrate, the substrate-holding surface being configured with a first pair of grooves extending between and from opposing ends of the substrate-holding surface in a first direction and a second pair of grooves extending between and from other opposing ends of the substrate-holding surface in a second direction that is substantially perpendicular to the first direction; and a substrate stage that supports the substrate holder to move in the first direction.

2. An exposure apparatus according to claim 1, wherein the substrate holder comprises a first holding member to hold the substrate at a first region of the substrate-holding surface defined by the first pair of grooves, and a second holding member to hold the substrate at a second region of the substrate-holding surface defined by the second pair of grooves.

3. An exposure apparatus according to claim 2, wherein the substrate holder comprises a selector that selects one of the first holding member and the second holding member.

4. An exposure apparatus according to claim 1, wherein the shape of the substrate is rectangular, and a distance between the first pair of grooves corresponds to the length of a shorter sides of the rectangular substrate.

5. An exposure apparatus according to claim 1, wherein the substrate holder holds the substrate by using a vacuum.

6. An exposure apparatus according to claim 1, further comprising a projection system located between the mask and the substrate to project the pattern onto the substrate.

7. An exposure apparatus according to claim 1, wherein the exposure apparatus is a scanning type exposure apparatus.

8. An exposure apparatus that exposes a pattern of a mask onto a rectangular substrate, comprising:

a substrate holder having a substrate-holding surface to hold the rectangular substrate;

a substrate stage that supports the substrate holder to move in a first direction; and a detector that detects whether the rectangular substrate is loaded on the substrate holding surface such that a longer side of the rectangular substrate is arranged along the first direction.

9. An exposure apparatus according to claim 8, wherein the shape of the substrate holder is rectangular, and a shorter side of the substrate holder is set shorter than the longer side of the substrate.

10. An exposure apparatus according to claim 8, wherein the detector comprises a vacuum sensor.

11. An exposure apparatus according to claim 8, wherein the substrate holder holds the substrate by using a vacuum.

12. An exposure apparatus according to claim 8, further comprising a projection system located between the mask and the rectangular substrate to project the pattern onto the rectangular substrate.

13. An exposure apparatus according to claim 8, wherein the exposure apparatus is a scanning type exposure apparatus.

14. An exposure method that exposes a pattern of a mask onto a substrate, the substrate being supported by a substrate holder having a substrate-holding surface, comprising the steps of:
   providing a first pair of grooves in the substrate-holding surface, where the first pair of grooves extend in a first direction between and from opposing ends of the substrate-holding surface;
   providing a second pair of grooves in the substrate-holding surface, where the second pair of grooves extend between and from other opposing ends of the substrate-holding surface in a second direction that is substantially perpendicular to the first direction; and
   conveying the substrate to the substrate-holding surface.

15. An exposure method according to claim 14, wherein the substrate holder comprises a first holding member to hold the substrate at a first region of the substrate-holding surface defined by the first pair of grooves, and a second holding member to hold the substrate at a second region of the substrate-holding surface defined by the second pair of grooves.

16. An exposure method according to claim 15, further comprising selecting one of the first holding member and the second holding member.

17. An exposure method according to claim 14, wherein the shape of the substrate holder and the substrate are rectangular, and a shorter side of the substrate holder is set shorter than the longer side of the substrate.

18. An exposure method that exposes a pattern of a mask onto a rectangular substrate while the mask and the rectangular substrate move in a first direction, comprising the steps of:
   providing a substrate holder having a substrate-holding surface to hold the rectangular substrate; and
   detecting whether the rectangular substrate is loaded on the substrate-holding surface such that a longer side of the rectangular substrate is arranged along the first direction.

19. An exposure method according to claim 18, wherein the shape of the substrate holder is rectangular, and a shorter side of the substrate holder is set shorter than the longer side of the substrate.

20. An exposure method according to claim 18, wherein the detecting step is conducted by a vacuum sensor.

* * * * *